United States Patent
Johnson et al.

(10) Patent No.: US 7,057,928 B2
(45) Date of Patent: Jun. 6, 2006

(54) SYSTEM AND METHOD FOR ERASING HIGH-DENSITY NON-VOLATILE FAST MEMORY

(75) Inventors: Steven C. Johnson, Eagle, ID (US); Peter James Fricke, Corvallis, OR (US); Andy Van Brocklin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/615,077

(22) Filed: Jul. 8, 2003

(65) Prior Publication Data

US 2005/0007808 A1    Jan. 13, 2005

(51) Int. Cl.
G11C 16/04 (2006.01)
(52) U.S. Cl. ............................ 365/185.01; 365/185.29; 365/185.33
(58) Field of Classification Search ........... 365/185.32, 365/185.29, 153, 127, 185.28, 185.26, 185.01, 365/218, 185.33, 226, 53, 185.05, 185.18
See application file for complete search history.

(56) References Cited

U.S. PATENT DOCUMENTS

| | | | | | |
|---|---|---|---|---|---|
| 5,159,433 | A | * | 10/1992 | Kazami et al. | 257/681 |
| 5,212,541 | A | * | 5/1993 | Bergemont | 257/319 |
| 5,339,272 | A | * | 8/1994 | Tedrow et al. | 365/189.09 |
| 5,495,450 | A | * | 2/1996 | Zollo et al. | 365/218 |
| 5,814,855 | A | * | 9/1998 | Arase et al. | 257/315 |
| 5,835,936 | A | * | 11/1998 | Tomioka et al. | 711/103 |
| 6,084,796 | A | * | 7/2000 | Kozicki et al. | 365/153 |
| 6,118,691 | A | * | 9/2000 | Kalnitsky et al. | 365/185.01 |
| 6,236,608 | B1 | * | 5/2001 | Ratnam | 365/218 |
| 6,278,120 | B1 | * | 8/2001 | May | 250/372 |
| 6,313,502 | B1 | * | 11/2001 | Widdershoven | 257/323 |
| 6,437,398 | B1 | * | 8/2002 | Widdershoven | 257/323 |
| 6,512,696 | B1 | * | 1/2003 | Fan et al. | 365/185.18 |
| 6,525,962 | B1 | * | 2/2003 | Pai et al. | 365/185.09 |
| 6,538,277 | B1 | * | 3/2003 | Sung et al. | 257/317 |
| 6,580,630 | B1 | * | 6/2003 | Liu et al. | 365/106 |
| 6,690,057 | B1 | * | 2/2004 | Frerichs | 257/315 |
| 6,740,927 | B1 | * | 5/2004 | Jeng | 257/315 |
| 2002/0126537 | A1 | * | 9/2002 | Kreifels et al. | 365/185.28 |
| 2003/0064564 | A1 | * | 4/2003 | Lin | 438/257 |
| 2003/0146465 | A1 | * | 8/2003 | Wu | 257/314 |
| 2004/0008541 | A1 | * | 1/2004 | Maayan et al. | 365/185.33 |
| 2005/0024968 | A1 | * | 2/2005 | Lee et al. | 365/218 |

FOREIGN PATENT DOCUMENTS

JP         03070172    *  3/1991    .................. 365/103

* cited by examiner

*Primary Examiner*—Richard Elms
*Assistant Examiner*—Dang Nguyen

(57) ABSTRACT

A system and method for erasing a high-density non-volatile fast memory is presented. In one embodiment the high-density non-volatile fast memory is a modified flash memory having modified flash cells. One embodiment of the system comprises ultra-violet (UV) light windows that permit exposure of the modified flash cells to UV light. The exposure of UV light onto the modified flash cells erases the modified flash cells.

25 Claims, 8 Drawing Sheets

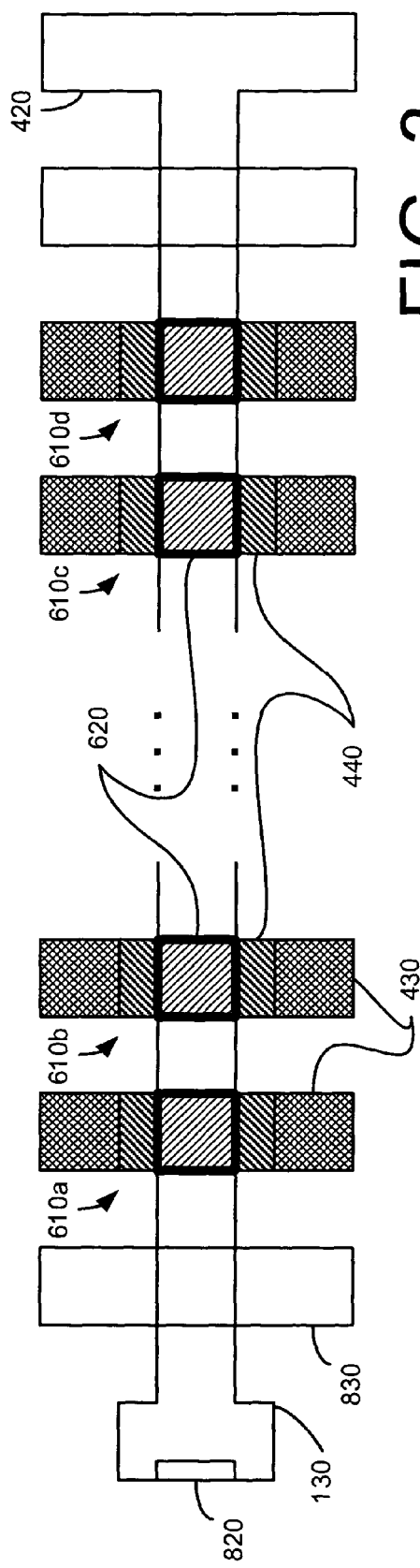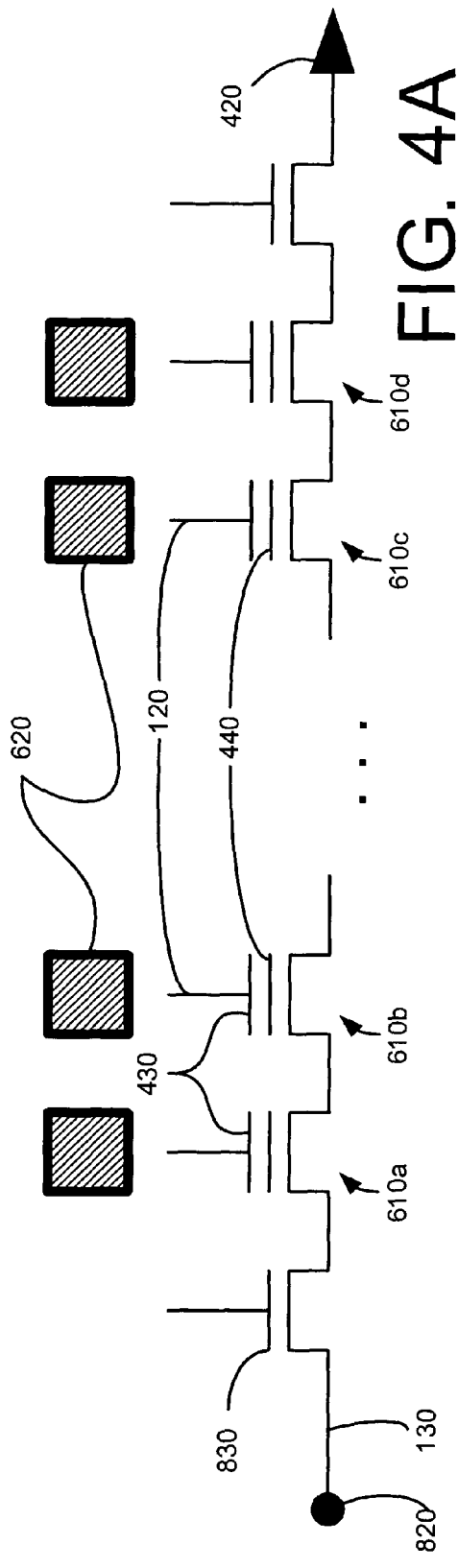

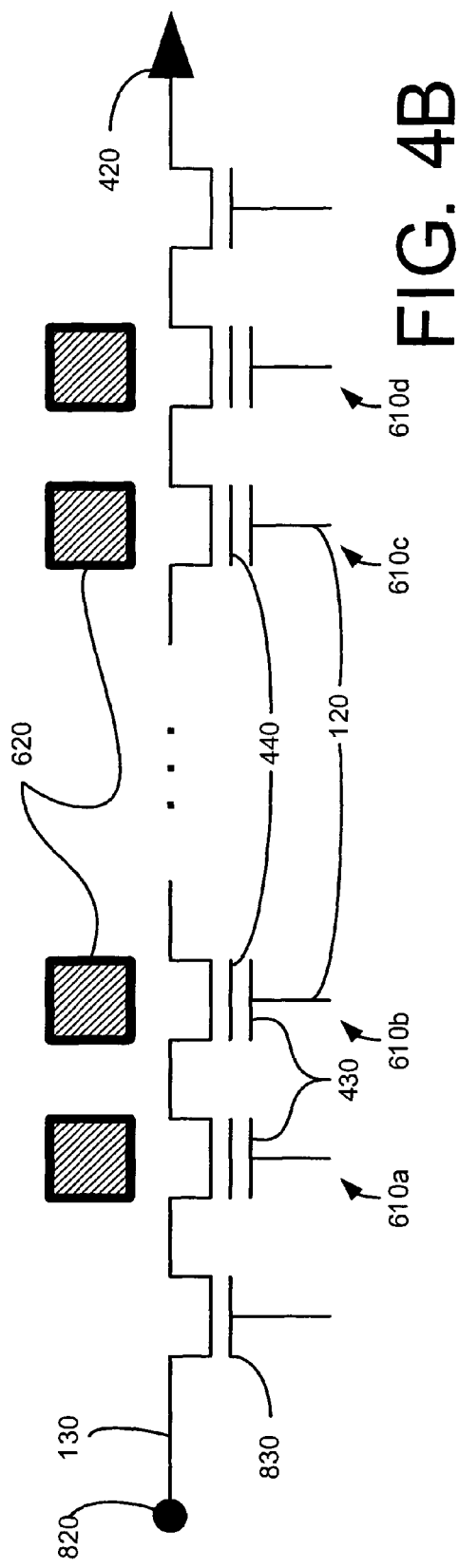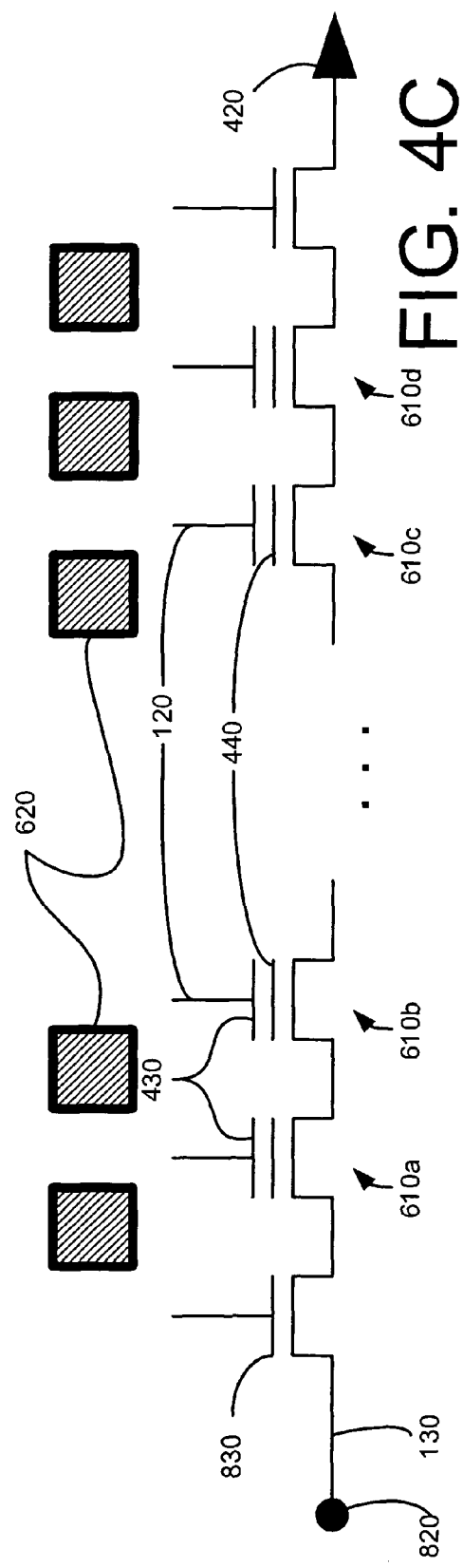

SYSTEM AND METHOD FOR ERASING HIGH-DENSITY NON-VOLATILE FAST MEMORY

BACKGROUND

EEPROMs, as is known in the art, require specialized on-chip circuitry to electrically discharge their floating gates. Additionally, since the discharging circuitry is attached to the floating gate transistors on a byte-by-byte basis, the complexity of the chip increases proportionally with an increase in the number of bytes in the EEPROM. Furthermore, since the memory cells of the EEPROM are written and erased at the byte level, the updating of memory in EEPROM is a relatively slow process.

In order to remedy the problem associated with EEPROM, the industry responded with high-density non-volatile fast memory, such as flash memory. Unlike the EEPROM memory, the erasing circuitry in flash memory is moved to the periphery of the memory array. The location of the erasing circuitry at the periphery of the memory permits erasure of entire blocks of data using in-circuit wiring. Thus, rather than erasing byte-by-byte, flash memory is erased and rewritten in large blocks of, for example, 8 kilobytes (K) to 128K. The block erasure and rewriting of flash memory results in faster performance of flash memory when compared to the performance of the EEPROM. Additionally, by moving the erasing circuitry to the periphery of the memory array, greater chip density is achievable than that of the EPROM or the EEPROM. Moreover, different configurations of flash memory (e.g., NAND configurations and NOR configurations) allow for rearrangement of a bit line and a word line. The rearrangement of bit lines and word lines permits balancing of chip density with chip processing speed.

Unfortunately, the complexity of the erasing circuitry is still present due to the nature of flash memory. Furthermore, a relatively high voltage is typically required to erase flash memory. Also, the aggregate cost of the erasing circuitry in flash memory is fairly significant, thereby making flash memory relatively expensive.

In view of the deficiencies associated with flash memory, a need exists in the art.

SUMMARY

The present disclosure provides systems and methods for erasing high-density non-volatile fast memory, such as modified flash cells.

Briefly described, in architecture, one embodiment of the system comprises modified flash cells, which have no erasing circuitry, and an ultraviolet (UV) light window. The UV light window is adapted to expose the modified flash cells to UV light.

The present disclosure also provides methods for erasing high-density non-volatile fast memory. In this regard, one embodiment of the method comprises the steps of exposing a modified flash cell to ultraviolet (UV) light, and erasing the modified flash cell using the UV light.

BRIEF DESCRIPTION OF THE DRAWINGS

Many aspects of the disclosure can be better understood with reference to the following drawings. The components in the drawings are not necessarily to scale.

FIG. 3 is a block diagram showing a top view of a modified flash memory array having UV light windows.

FIG. 4A is a circuit diagram of a modified flash memory array having UV light windows above the control gates of the floating gate transistors.

FIG. 4B is a circuit diagram of a modified flash memory array having UV light windows below the substrate of the floating gate transistors.

FIG. 4C is a circuit diagram of a modified flash memory array having UV light windows between the control gates of the floating gate transistors.

DETAILED DESCRIPTION

Figure 1A:
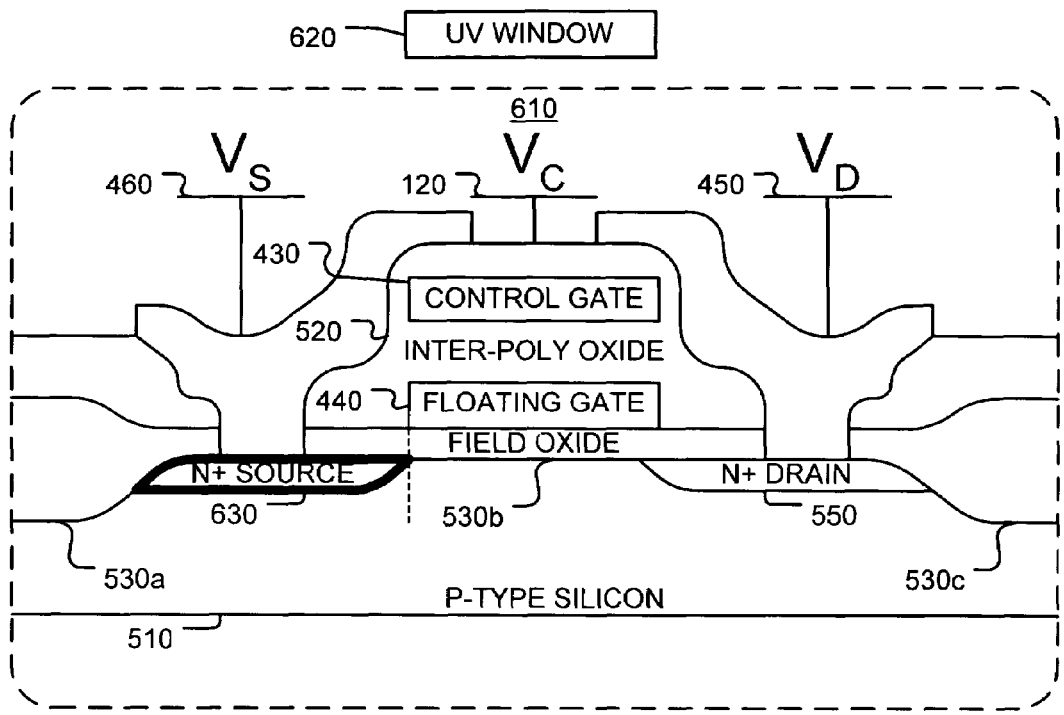
FIG. 1A is a diagram illustrating a modified flash cell having a window for ultraviolet (UV) light.

Reference is now made in detail to the description of the embodiments as illustrated in the drawings.

In order to provide simpler circuitry in high-density non-volatile fast memory (e.g., modified flash cells as described with reference to FIG. 1A, and two-terminal drain-gate-connected modified flash cells as described with reference to FIG. 1B), erasing circuitry is removed from the chip and replaced with windows that permit the entry of ultraviolet (UV) light. The UV light excites electrons on the floating gates of the high-density non-volatile fast memory and erases the circuit without the need for erasing circuitry. While UV light is specifically described herein, it should be appreciated that other types of radiation may be used so long as that radiation is sufficient to excite the electrons on the floating gate.

FIG. 1A is a diagram illustrating a high-density non-volatile fast memory 610 having windows 620 for UV light (hereinafter "UV light windows"). For simplicity, the high-density non-volatile fast memory 610 having three terminals is referred to herein as a modified flash cell 610.

The modified flash cell 610 comprises a control gate 430, a floating gate 440, and an inter-poly (IP) oxide layer that separates the control gate 430 from the floating gate 440. Furthermore, the modified flash cell 610 comprises a positively-doped silicon substrate 510 (hereinafter "p-type substrate") and a field oxide layer 530 that separates the floating gate 440 from the p-type substrate 510. Additionally, the modified flash memory 610 comprises a negatively-doped source (hereinafter "n+ source") 630 and a negatively-doped drain (hereinafter "n+ drain") 550. As shown in FIG. 1A, the configuration of the n+ source 630 is different from the configuration of a standard flash cell. Unlike the standard flash cell in which the n+source 560 overlaps with the floating gate 440, the n+ source 630 in the modified flash cell 610 does not overlap with the floating gate 440. The removal of overlap between the n+ source 630 and the floating gate 440 eliminates the ability to electrically erase the modified flash cell 610. The erasure, therefore, is accomplished by exposing the modified flash cell 610 to ultraviolet (UV) light through a UV light window 620. In the embodiment of FIG. 1A, the UV light window 620 is placed directly over the control gate 430. Also, in one embodiment, the UV light windows 620 are configured to diffuse the light, thereby globally irradiating the modified flash cells 610 with UV light. The diffusing of light may be accomplished by using frosted glass or other apparatuses known to diffuse light such as, for example, diffraction gratings.

In addition to removing complicated erasing hardware, the removal of the overlap between the n+ source 630 and the floating gate 440 provides a relaxed dimension constraint between source and drain regions. Removal of this overlap provides greater scalability to smaller geometries. In other words, an increased chip density may be achieved by removing the overlapping region between the n+ source 630 and the floating gate 440.

Figure 1B:
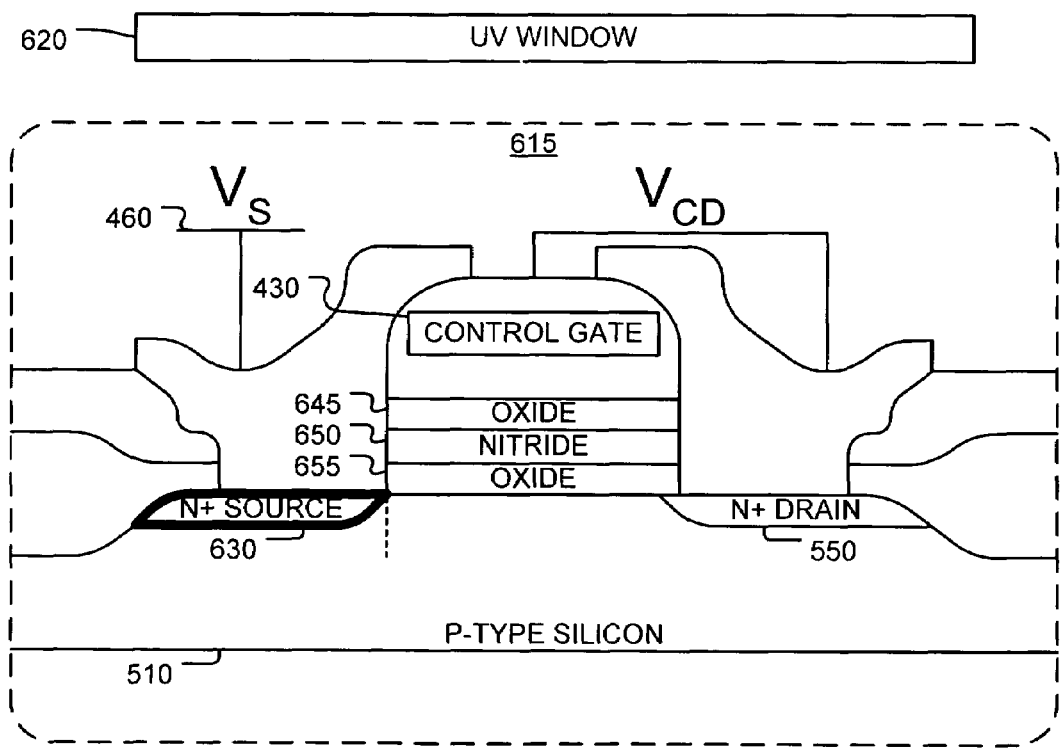
FIG. 1B is a diagram illustrating a two-terminal drain-gate-connected modified flash cell having a window for UV light.

FIG. 1B is a diagram illustrating a high-density two-terminal non-volatile memory cell 615 (hereinafter "two-terminal drain-gate-connected modified flash cell"). The two-terminal drain-gate-connected modified flash cell 615 may be a modified nitrided read-only memory (NROM) having the source and gate electrically shorted so that electrons are only stored on the drains side. In other words, a two-terminal drain-gate-connected modified flash cell 615 may be derived by diode connecting the NROM cell. As shown in FIG. 1B, the two-terminal drain-gate-connected modified flash cell 615 comprises a first oxide layer 645, a nitride layer 650, and a second oxide layer 655 that substitute for the field oxide 530 and the floating gate 440 of a modified flash cell. The first oxide layer 645, the nitride layer 650, and the second oxide layer 655 are known in the aggregate as the oxide-nitride-oxide (ONO) layer. Since, as shown in FIG. 1B, the drain and the gate are electrically shorted, the two-terminal drain-gate-connected modified flash cell 615 exhibits diode-like behavior. Thus, the two-terminal drain-gate-connected modified flash cell 615 is programmed by channel hot-electron injection, similar to the process of programming the modified flash cell 610 of FIG. 1A.

Erasure of the two-terminal drain-gate-connected modified flash cell 615 is accomplished by exposing the two-terminal drain-gate-connected modified flash cell 615 to ultraviolet (UV) light through a UV light window 620. In the embodiment of FIG. 1B, the UV light window 620 is placed over the two-terminal drain-gate-connected modified flash cell 615. Furthermore, the UV light window 620 may be configured to diffuse the light similar to that described with reference to FIG. 1B.

Figure 2:
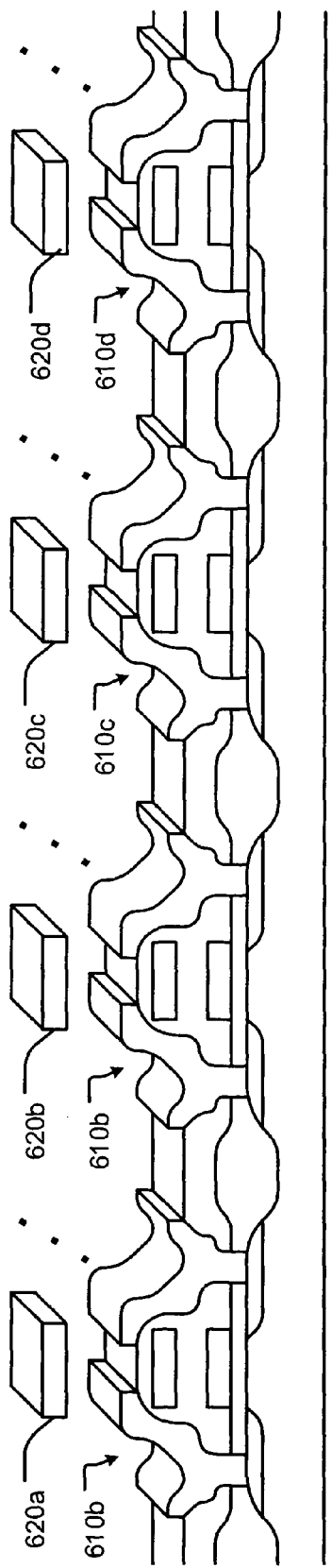
FIG. 2 is a block diagram illustrating a plurality of modified flash cells having UV light windows.

FIG. 2 is a block diagram illustrating a plurality of modified flash cells 610 having UV light windows 620. As shown in FIG. 2, the embodiment of FIG. 1A may be extended to a plurality of modified flash cells 610. Thus, as shown in FIG. 2, each flash cell 610 has a UV light window 620 placed directly over the control gate 430 of the modified flash cell 610. While only a one-dimensional array is shown in FIG. 2, the one-dimensional array may further be expanded to a two-dimensional planar configuration, or even to a three-dimensional layered configuration. This embodiment is described in greater detail in FIGS. 5 and 6. While not specifically shown in FIG. 2, the two-terminal drain-gate-connected modified flash cells 615 of FIG. 1B may also be extended to a plurality of cells.

FIG. 3 is a block diagram showing a top view of a modified flash memory array having UV light windows. Specifically, a modified NAND flash array with UV light windows 620 is shown in FIGS. 3 through 6. The modified NAND flash array comprises a bit line 130, a bit line contact 820, a select gate 830, a control gate 430, a floating gate 440, and a source line 420. As seen from the top-view of FIG. 3, the select gate 830 and the modified flash cells 610 are configured to be perpendicular to the bit line 130. Thus, the select gate 830 is adapted to select the modified flash cells 610 in the entire bit line 830, and appropriate word lines (not shown in FIG. 3) are adapted to select the individual modified flash cells 610 attached to the bit line 130. The floating gates 440 of the modified flash cells 610 are located above the bit line 130, and the control gates 430 of the modified flash cells 610 are located above their respective control gates 430. The UV light window 620 is located above the modified flash cells 610, and permits UV light to access the floating gate 440. While not specifically shown in FIG. 3, the two-terminal drain-gate-connected modified flash cells 615 of FIG. 1B may also be configured as a NAND array having a UV window 620.

FIG. 4A is a circuit diagram of the modified flash memory array from FIG. 3. As shown in FIG. 4A, the modified flash memory array has UV light windows 620 above the control gates 430 of the modified flash cells 610. Thus, when UV light enters the UV light windows 620, the UV light excites the electrons that are trapped on the floating gate 440. The excitation of the electrons provides enough energy to the electrons to migrate from the floating gate 440 back to the n+ source (not shown in FIG. 4A).

FIG. 4B is a circuit diagram of another embodiment of a modified flash memory array having UV light windows 620. Unlike the embodiment of FIG. 4A, the UV light windows 620 in the embodiment of FIG. 4B are placed underneath the substrate, rather than above the control gate 430. Thus, in the embodiment of FIG. 4B, the modified flash cells 610 are irradiated with UV light from beneath the circuit, rather than from above the circuit as in FIG. 4A. Once the energy (hereinafter "UV energy") from the UV light diffuses into the floating gates 610, the UV energy excites the electrons, which migrate from the floating gates 430 back to the n+ source.

FIG. 4C is a circuit diagram of yet another embodiment of a modified flash memory array having UV light windows. Unlike the embodiments of FIGS. 4A and 4B, the UV light windows 620 in the embodiment of FIG. 4C are placed between the control gates 430 of the modified flash cells 610. Thus, if light-diffusing windows are used for the UV light windows 620, then the UV light entering the UV light windows globally irradiates the modified flash cells 610 and permits the UV energy to diffuse transversely into the floating gates 440. Once the UV energy diffuses into the floating gates 610, the UV energy excites the electrons, and the excited electrons migrate back to the n+ source from the floating gates 430.

While not specifically shown in FIGS. 4A through 4C, the two-terminal drain-gate-connected modified flash cells 615 of FIG. 1B may also be arranged in similar fashion.

Figure 5:
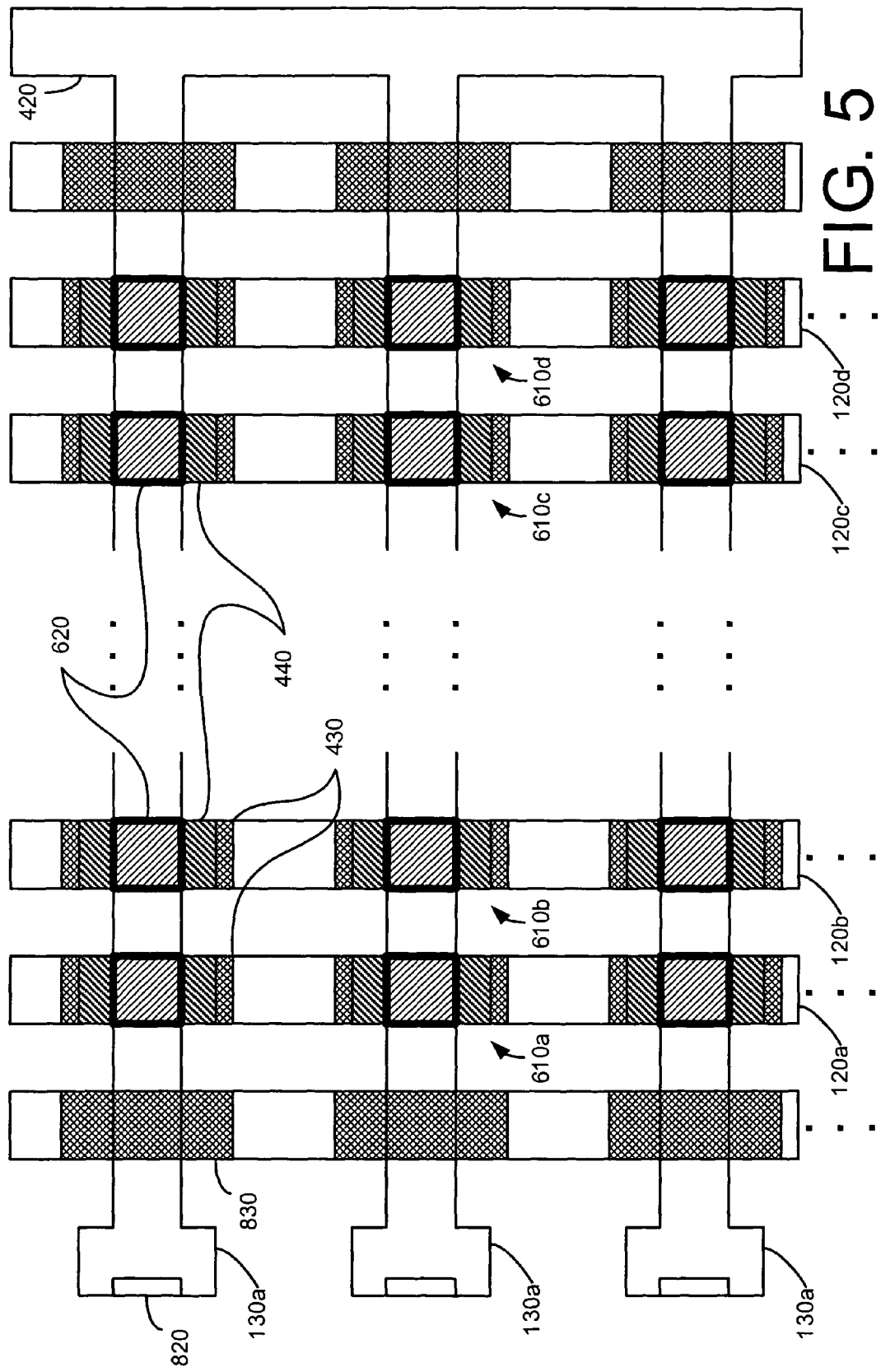
FIG. 5 is a block diagram showing a top view of a modified flash memory having UV light windows directly above the control gate of the floating gate transistors.

FIG. 5 is a block diagram showing a top view of one embodiment of a modified flash memory. In the embodiment of FIG. 5, the memory has UV light windows 620 directly above the control gates 430 of the modified flash cells 610. Unlike the embodiment of FIG. 3, which is a one-dimensional array of a modified NAND flash memory, the embodiment of FIG. 5 is a two-dimensional planar configuration of a modified NAND flash memory. As shown in FIG. 5, each of the modified flash cells 610 are located at the juncture of a word line 120 and a bit line 130. Thus, for example, a specific modified flash cell 610 may be write-accessed or read-accessed through the appropriate word line 120 and the appropriate bit line 130.

Given this configuration, when UV light enters the UV light windows 620, the UV light excites the electrons that are trapped on the floating gate 440. The excitation of the electrons provides enough energy for the electrons to migrate from the floating gate 440 back to the n+ source (not shown in FIG. 5).

While only one layer of memory is shown in FIG. 5, additional layers may be provided to increase memory capacity. Thus, for modified flash cells 610 configured as multiple layers, the exposure of UV energy through the UV light windows 620 excites the electrons that are trapped on the floating gates 440 at the various layers. The excitation of the electrons provides enough energy for the electrons to migrate from the floating gate 440 of the various layers back to the n+ source (not shown in FIG. 5) at the various layers.

Figure 6:
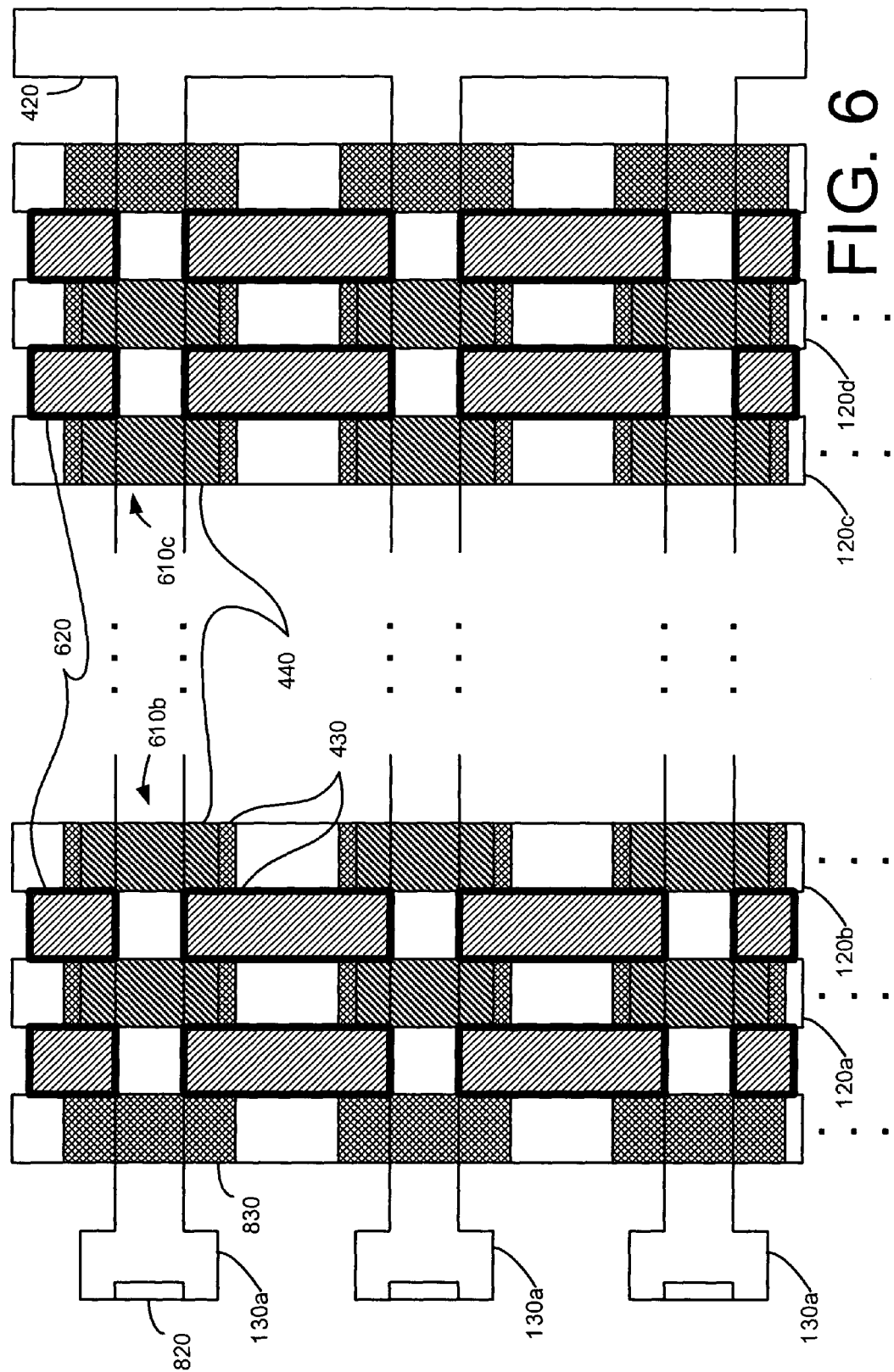
FIG. 6 is a block diagram showing a top view of a modified flash memory having UV light windows offset from the control gate of the floating gate transistors.

FIG. 6 is a block diagram showing a top view of another embodiment of a modified flash memory. In the embodiment of FIG. 6, the memory has UV light windows 620 that are offset from the control gate 440 of the modified flash cells 610. In this regard, rather than having the UV light directly hit the control gate 440, the embodiment of FIG. 6 permits UV energy to transversely diffuse into the modified flash cells 610. Thus, once the UV energy enters through the UV light windows 620 and transversely diffuses to the floating gates 440, the UV energy excites the electrons that are trapped on the floating gates 440. The excitation of the electrons provides enough energy for the electrons to migrate from the floating gate 440 back to the n+ source (not shown in FIG. 6).

While only one layer of memory is shown in FIG. 6, additional layers may be provided to increase memory capacity. Thus, for modified flash cells 610 configured as multiple layers, UV energy diffuses through the UV light windows 620 and the various layers, thereby exciting the electrons that are trapped on the floating gates 440 at the various layers. The excitation of the electrons provides enough energy for the electrons to migrate to the n+ source (not shown in FIG. 6) from the floating gate 440 of the various layers.

Also, while not specifically shown in FIGS. 5 and 6, the two-terminal drain-gate-connected modified flash cells 615 of FIG. 1B may also be configured as a two-dimensional planar matrix or as three-dimensional layers.

Figure 8:
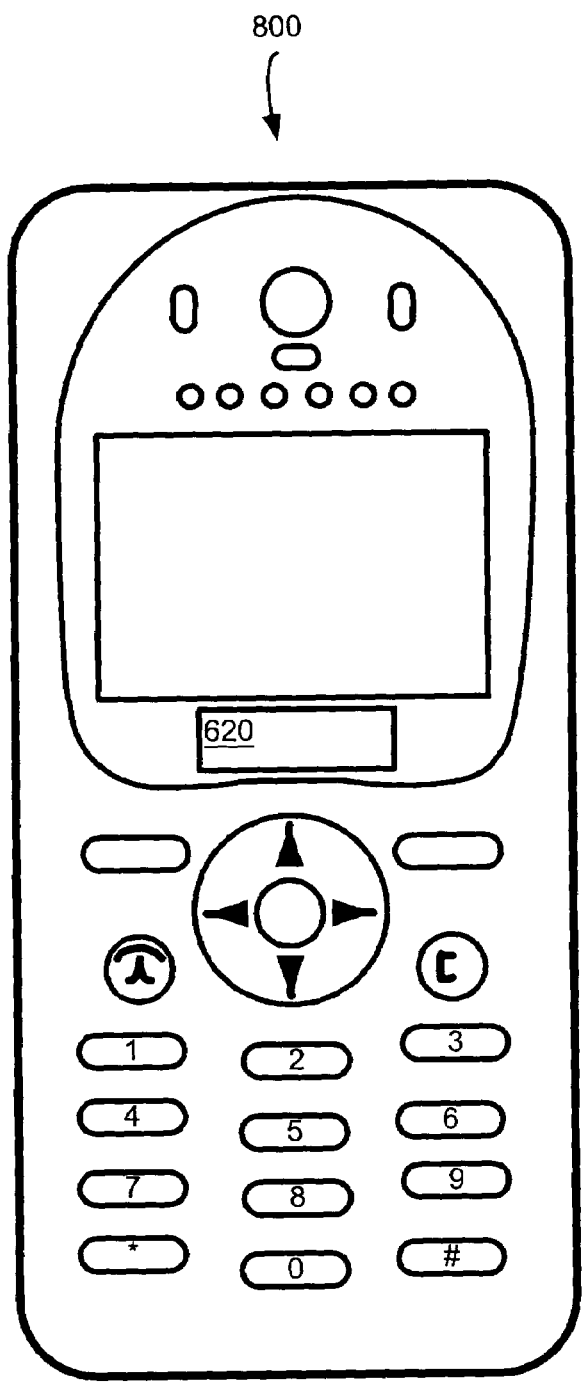
FIG. 8 is a diagram showing a cellular telephone having a UV light window.

As shown in FIGS. 1A through 6, the need for erasing circuitry may be eliminated by having UV light windows 620 that expose the modified flash cells 610 to UV light. Additionally, unlike the UV erasable EPROMS of the prior art, by using modified flash cells 610, a much greater chip density may be achieved, and, also, much faster chips may be built as compared to conventional UV erasable EPROMS. Moreover, if the modified flash cells 610 having the UV light windows 620 are used in portable devices such as cell phones or personal digital assistants (PDA), then the UV light windows 620 may be directly built into these devices. Thus, the modified flash cells 610 may be erased while they are housed in the cell phone or PDA. One example of a portable device having a UV light window 620 is shown in FIG. 8. Specifically, a cell phone 800 is shown in FIG. 8 as the portable device having the UV light window 620.

While FIGS. 1A through 6 show several embodiments of a system for erasing high-density non-volatile fast memory (e.g., modified flash cells 610, or two-terminal drain-gate-connected modified flash cells 615), another embodiment may be seen as a method for erasing high-density non-volatile fast memory. One embodiment of the method is shown in FIG. 7.

Figure 7:
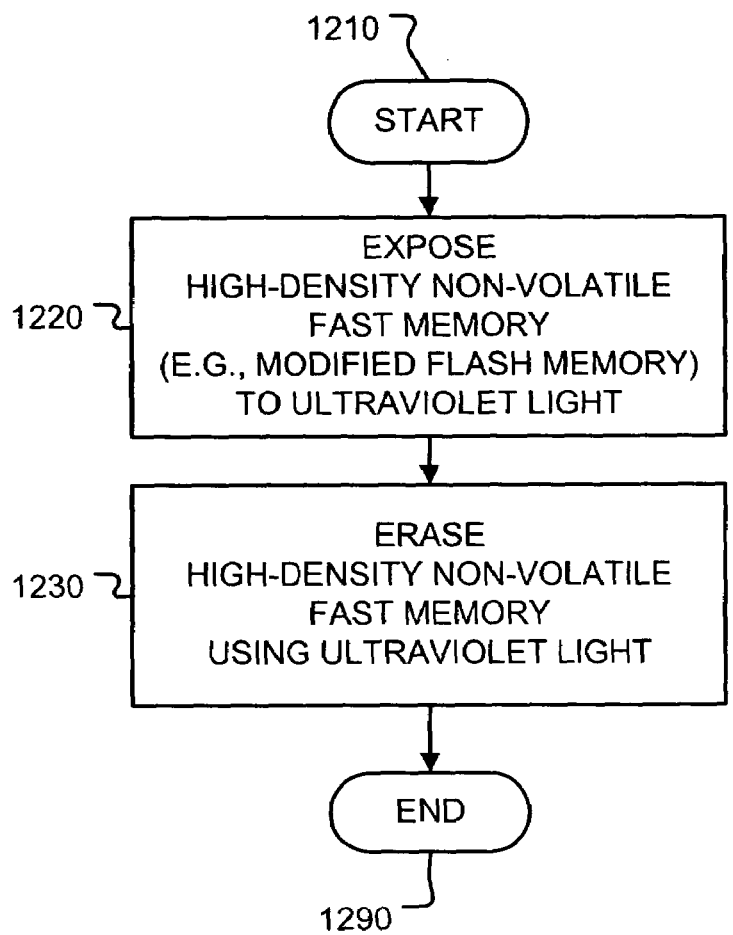
FIG. 7 is a flowchart showing one embodiment of the method of the invention.

FIG. 7 is a flowchart showing a method for erasing high-density non-volatile fast memory. As shown in FIG. 7, one embodiment of the method comprises exposing (1220) a high-density non-volatile fast memory to UV light, and erasing (1230) the high-density non-volatile fast memory using the UV light. The high-density non-volatile fast memory may be a modified flash memory (e.g., the modified flash cell of FIG. 1A), or a two-terminal drain-gate-connected modified flash memory (e.g., the two-terminal drain-gate-connected modified flash of FIG. 1B).

Although exemplary embodiments have been shown and described, various changes, modifications, or alterations may be made. For example, while an example of a NAND array is shown in the drawings, a NOR flash array may be used. Furthermore, while specific embodiments are shown using modified flash memories and two-terminal drain-gate-connected modified flash memories, other high-density non-volatile fast memories may be compatible with the embodiments described herein. Furthermore, while specific embodiments are shown with multiple UV light windows at various locations with reference to the control gates, a single large UV light window or several smaller UV light windows may be used to irradiate the entire memory chip with UV energy. Also, while cell phones and PDA devices have been provided as example environments in which modified flash cells may be used, the modified flash cells may be used in any electronic device that uses high-density non-volatile fast memory, such as, for example, an MP3 player or a portable computer. All such changes, modifications, and alterations should therefore be seen as within the scope of the present disclosure.

What is claimed is:

1. A system comprising:
   modified flash cells having no erasing circuitry; and
   a plurality of ultraviolet (UV) light windows adapted to individually expose the modified flash cells to UV light to selectively erase individual modified flash cells.

2. The system of claim 1, wherein the UV light windows are located above a control gates of the modified flash cells.

3. The system of claim 1, wherein the UV light windows are located below a substrate of the modified flash cells.

4. The system of claim 1, wherein the UV light windows are interposed between control gates of the modified flash cells.

5. The system of claim 1, wherein the UV light windows are offset from control gates of the modified flash cells.

6. The system of claim 1, wherein the UV light windows are adapted to diffuse UV light entering the UV light windows.

7. The system of claim 1, wherein the modified flash cells are arranged in a NAND configuration.

8. The system of claim 1, wherein the modified flash cells are arranged in a NOR configuration.

9. The system of claim 1, wherein the modified flash cells are configured as a two-dimensional planar matrix of cells.

10. The system of claim 9, wherein the two-dimensional planar matrix of cells is a NAND configuration.

11. The system of claim 9, wherein the two-dimensional planar matrix of cells is a NOR configuration.

12. The system of claim 1, wherein the modified flash cells are configured as three-dimensional layers.

13. The system of claim 12, wherein the three-dimensional layers comprise modified flash cells arranged in a NAND configuration.

14. The system of claim 12, wherein the three-dimensional layers comprise modified flash cells arranged in a NOR configuration.

15. The system of claim 1, further comprising an electronic device adapted to house the modified flash cells, the electronic device having openings to receive the UV light windows.

16. The system of claim 15, wherein the electronic device is a portable electronic device.

17. The system of claim 16, wherein the portable electronic device is a cellular telephone.

18. The system of claim 16, wherein the portable electronic device is a personal digital assistant (PDA).

19. The system of claim 16, wherein the portable electronic device is an MP3 player.

20. The system of claim 16, wherein the portable electronic device is a lap-top computer.

21. A method comprising:
  selectively exposing individual modified flash cells to ultraviolet (UV) light passed through independent UV light windows adjacent the modified flash cells; and
  erasing the selected modified flash cells using the UV light without the use of any erasing circuitry.

22. A system comprising:
  means for selectively exposing a individual modified flash cells to ultraviolet (UV) light passed through independent UV light windows adjacent the modified flash cells such that the selected modified flash cells are erased without the use of any erasing circuitry.

23. The system of claim 1, wherein the modified flash cells are two-terminal drain-gate-connected modified flash cells.

24. The method off claim 21, wherein the modified flash cells are two-terminal drain-gate-connected modified flash cells.

25. The system of claim 22, wherein the modified flash cells are two-terminal drain-gate-connected modified flash cells.

* * * * *

UNITED STATES PATENT AND TRADEMARK OFFICE
CERTIFICATE OF CORRECTION

PATENT NO. : 7,057,928 B2  Page 1 of 1
APPLICATION NO. : 10/615077
DATED : June 6, 2006
INVENTOR(S) : Steven C. Johnson et al.

It is certified that error appears in the above-identified patent and that said Letters Patent is hereby corrected as shown below:

In column 6, line 42, in Claim 2, after "above" delete "a".

In column 8, line 4, in Claim 22, after "exposing" delete "a".

In column 8, line 13, in Claim 24, after "method" delete "off" and insert -- of --, therefor.

Signed and Sealed this

Twenty-third Day of June, 2009

JOHN DOLL
*Acting Director of the United States Patent and Trademark Office*